United States Patent
Pignolo et al.

(10) Patent No.: US 11,611,321 B2
(45) Date of Patent: Mar. 21, 2023

(54) OPERATIONAL AMPLIFIER

(71) Applicant: STMicroelectronics (Grenoble 2) SAS, Grenoble (FR)

(72) Inventors: Philippe Pignolo, Crolles (FR); Vincent Rabary, Champagnier (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 17/404,457

(22) Filed: Aug. 17, 2021

(65) Prior Publication Data
US 2022/0069790 A1 Mar. 3, 2022

(30) Foreign Application Priority Data
Aug. 31, 2020 (FR) ........................... 2008822

(51) Int. Cl.
*H03F 3/45* (2006.01)
(52) U.S. Cl.
CPC ............... *H03F 3/45273* (2013.01)
(58) Field of Classification Search
CPC ... H03F 3/04; H03F 3/301; H03F 3/16; H03F 3/45; H03F 3/45071; H03F 3/45076; H03F 3/45179; H03F 3/4521; H03F 3/45237; H03F 3/45269; H03F 3/45273; H03F 3/45747; H03F 2200/555; H03F 2203/45146; H03F 2203/45344

See application file for complete search history.

(56) References Cited

U.S. PATENT DOCUMENTS

| 6,194,962 | B1 | 2/2001 | Chen |
| 6,696,894 | B1* | 2/2004 | Huang ............... H03F 3/45766 330/253 |
| 11,031,917 | B2* | 6/2021 | Binet ................ H03F 3/45475 |
| 2002/0060598 | A1 | 5/2002 | Kimura |
| 2010/0109781 | A1 | 5/2010 | Deguchi et al. |

* cited by examiner

*Primary Examiner* — Long Nguyen
(74) *Attorney, Agent, or Firm* — Slater Matsil, LLP

(57) ABSTRACT

The present disclosure relates to an electronic device comprising a pair of first transistors, each first transistor being coupled to a first node by a conduction terminal, a pair of second transistors, each second transistor being coupled to a second node by a conduction terminal, and a third transistor coupling the first and second nodes, the control terminal of the third transistor being coupled to the output of an operational amplifier, the operational amplifier being coupled, at its input, to the first node and to a node of application of a reference voltage.

20 Claims, 3 Drawing Sheets

1

OPERATIONAL AMPLIFIER

CROSS-REFERENCE TO RELATED APPLICATIONS

This application claims the benefit of French Patent Application No. 2008822, filed on Aug. 31, 2020, which application is hereby incorporated herein by reference.

TECHNICAL FIELD

The present disclosure generally concerns electronic devices and, more specifically, operational amplifiers.

BACKGROUND

An operational amplifier is a differential amplifier. In other words, an operational amplifier is an electronic amplifier which amplifies an electric potential difference present at its inputs.

Initially, operational amplifiers have been designed to perform mathematical operations in analog devices; they enabled easily implemented basic mathematical operations such as addition, subtraction, integration, derivation, and others.

Currently, operational amplifiers are used in many other applications such as the control of motors, voltage regulation, current sources, or also oscillators.

SUMMARY

An embodiment overcomes all or part of the disadvantages of known operational amplifiers.

One embodiment provides an electronic device comprising a pair of first transistors, each first transistor being coupled to a first node by a conduction terminal, a pair of second transistors, each second transistor being coupled to a second node by a conduction terminal, and a third transistor coupling the first and second nodes, the control terminal of the third transistor being coupled to the output of an operational amplifier, the operational amplifier being coupled, at its input, to the first node and to a node of application of a reference voltage.

According to an embodiment, the device is an operational amplifier.

According to an embodiment, the third transistor is coupled to the second node by a current mirror.

According to an embodiment, the device comprises an inverting input, a non-inverting input, and two power supply inputs.

According to an embodiment, the control terminal of one of the first transistors and the control terminal of one of the second transistors are coupled to the non-inverting input and the control terminal of the other one of the first transistors and the control terminal of the other one of the second transistors are coupled to the inverting input.

According to an embodiment, the first node is coupled to the first power supply input by a current source.

According to an embodiment, the second node is coupled to the second power supply input by the conduction terminals of a fourth transistor.

According to an embodiment, a conduction terminal of the third transistor is coupled to the first node and the conduction terminal of the third transistor is coupled to a first conduction terminal of a fifth transistor, the second conduction terminal of the fifth transistor being coupled to the second power supply input, the control terminal of the fifth transistor being coupled to the first conduction terminal of the fifth transistor and to the control terminal of the fourth transistor.

According to an embodiment, a non-inverting input of the operational amplifier comprised in the device is coupled to the first power supply input by a resistor and to the second power supply input by a current source.

According to an embodiment, the first transistors are coupled by their source to the first node and the second transistors are coupled by their source to the second node.

According to an embodiment, the surface area of the third transistor is at least five times smaller than that of the first and second transistors.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless specified otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
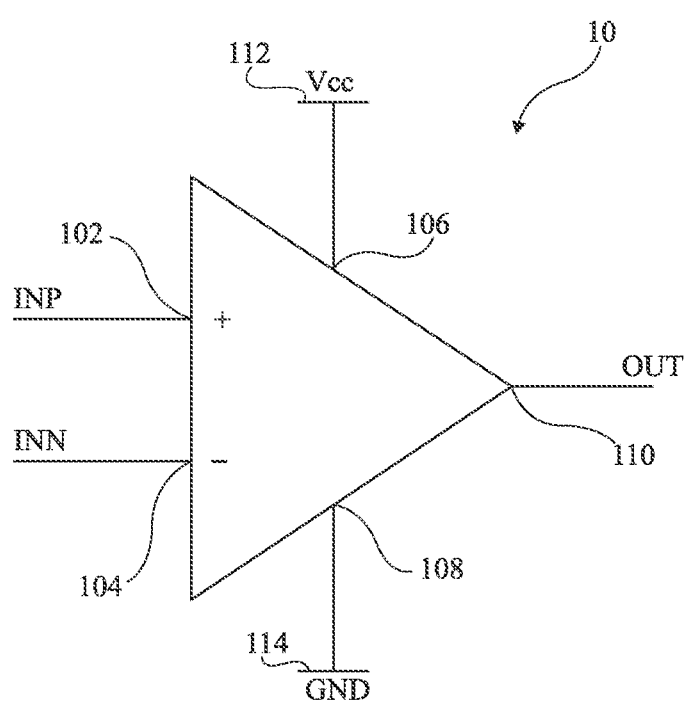
FIG. 1 schematically shows an operational amplifier.

FIG. 1 schematically shows an operational amplifier 10. Amplifier 10 comprises four inputs 102, 104, 106, 108 and one output 110.

Input 102 is a non-inverting input (+). Input 102 receives an input signal INP. Input 104 is an inverting input (−). Input 104 receives an input signal INN.

Inputs 106 and 108 are power supply inputs. The power supply input of operational amplifier 10 is delivered between inputs 106 and 108. In other words, node 106 is coupled, preferably connected, to a node or rail 112. Node 112 is coupled, preferably connected, to a voltage source delivering a voltage, for example, a power supply voltage Vcc.

Node 108 is coupled, preferably connected, to a node or rail 114. Node 114 is coupled, preferably connected, to a voltage source delivering a reference voltage (GND), for example, the ground. Power supply voltage Vcc is thus delivered between nodes 106 and 108.

Output no delivers an output signal OUT, depending on the difference between input signals INN and INP. More generally, the value of output voltage VOUT is dependent on the difference between the voltage received on the non-inverting input and the voltage received on the inverting input.

Operational amplifier 10 is an input rail-to-rail operational amplifier, that is, it may ideally amplify the difference of potential between the inputs 102 and 104. The potentials received at the inputs of the operational amplifier can have values between the value of the voltage on the node 114 and on the node 112.

Thus, according to the value of the difference between input voltage INN and input voltage INP, amplifier 10 delivers an output voltage OUT capable of ranging from the voltage supplied on node 108 to the voltage supplied on node 106.

Operational amplifier 10 comprises, between inputs 102 and 104 and output no, three stages, not shown: a differential amplification input stage, an intermediary amplification stage, or intermediary stage, and an output stage.

Figure 2:
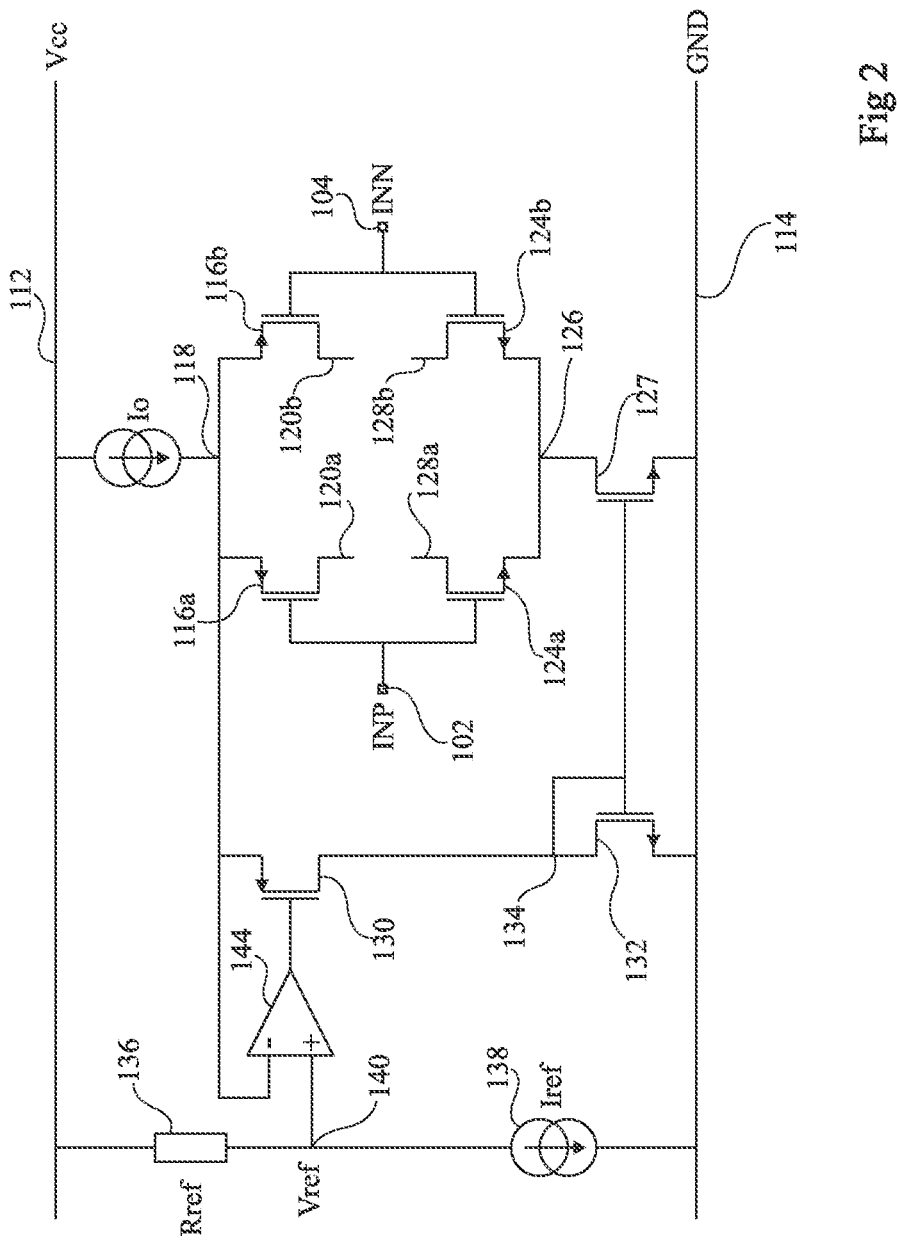
FIG. 2 shows in further detail an embodiment of an operational amplifier such as that in FIG. 1.

FIG. 2 shows in further detail a portion of an embodiment of an operational amplifier such as that of FIG. 1. More particularly, FIG. 2 shows an example of an input differential stage of operational amplifier 10.

Operational amplifier 10 is a precision amplifier. Amplifier 10 is thus mainly used in applications where the precision of the performed amplification is important.

Amplifier 10 comprises a first pair of transistors 116a and 116b. Preferably, transistors 116a and 116b are MOSFET (Metal Oxide Semiconductor Field Effect Transistor) transistors. Transistors 116a and 116a are preferably P-type transistors.

Transistors 116a and 116b are, in the embodiment of FIG. 2, coupled in a common-source type configuration. In other words, the sources of transistors 116a and 116b are coupled, preferably connected, to each other. In other words, the source of transistor 116a is coupled, preferably connected, to a node 118 and the source of transistor 116b is coupled, preferably connected, to node 118.

The other conduction terminal, here, the drain, of each of transistors 116a and 116b is coupled, preferably connected, to another stage of the operational amplifier, for example, the intermediary stage, not shown. Preferably, the drains of transistors 116a and 116b, respectively a drain 120a and a drain 120b, are coupled to nodes of the intermediary stage, the nodes coupled to drains 120a and 120b being different from each other. The drains of transistors 116a and 116b are preferably not connected to each other.

In other words, transistor 116a is coupled, by its conduction terminals, between node 118 and a first node, not shown, of the intermediary stage. Similarly, transistor 116b is coupled, by its conduction terminals, between node 118 and a second node, not shown, of the intermediary stage.

Transistors 116a and 116b are controlled by the input signals of operational amplifier 10. Transistor 116a is controlled by signal INP. In other words, the control terminal, or gate, of transistor 116a is coupled, preferably connected, to input node 102. Similarly, transistor 116b is controlled by signal INN. In other words, the control terminal, of transistor 116b is coupled, preferably connected, to input node 104.

Node 118 is coupled to rail 112 of application of voltage Vcc. Node 118 is coupled to rail 112 by a current source 122 delivering a current Io. Thus, current source 122 is coupled, preferably connected, by one terminal to rail 112 and by another terminal to node 118.

Operational amplifier 10 further comprises a second pair of transistors 124a and 124b. Preferably, transistors 124a and 124b, are preferably MOSFET (Metal Oxide Semiconductor Field Effect Transistor) transistors. Transistors 124a and 124b, are preferably N-type transistors.

Transistors 124a and 124b are coupled in a configuration of common-source type. In other words, the sources of transistors 124a and 124b are coupled, preferably connected, to each other. In other words, the source of transistors 124a is coupled, preferably connected, to a node 126 and the source of transistor 124b, is coupled, preferably connected, to node 126.

The other conduction terminal, here, the drain, of each of transistors 124a and 124b, is coupled, preferably connected, to another stage of the operational amplifier, for example, the intermediary stage, not shown. Preferably, the drains of transistors 116a and 116b, respectively a drain 128a and a drain 128b, are coupled to nodes of the intermediary stage, the nodes coupled to drains 128a and 128b being different from each other. The drains of transistors 124a and 124b, are preferably not connected to each other.

In other words, transistor 124a is coupled, by its conduction terminals, between node 126 and a third node of the intermediary stage. Similarly, transistor 124b, is coupled, by its conduction terminals, between node 126 and a fourth node of the intermediary stage. Preferably, the third and fourth nodes of the intermediary stage are different from the first and second nodes of the intermediary stage.

Node 126 is coupled to rail 114 of application of reference voltage GND. Node 126 is coupled to rail 114 by a transistor 127. Preferably, transistor 127 is a MOSFET transistor. More particularly, transistor 127 is coupled, preferably connected, by a conduction terminal, for example, its source, to rail 114 and by another conduction terminal, for example its drain, to node 126.

Transistors 124a and 124b, are controlled by the input signals of operational amplifier 10. Transistor 124a is controlled by signal INP. In other words, the control terminal, or gate, of transistor 124a is coupled, preferably connected, to input node 102. Similarly, transistor 124b, is controlled by signal INN. In other words, the control terminal, or gate, of transistor 124b, is coupled, preferably connected, to input node 104.

Operational amplifier 10 further comprises a transmission transistor 130. Transistor 130 is for example a MOSFET-type transistor, preferably P-type. Transistor 130 preferably has dimensions smaller than the dimensions of transistors 116a, 116b, 124a, and 124b. For example, the surface area of each of transistors 116a, 116b, 124a, and 124b, is equal to at least five times, preferably equal to eight times, the surface area of transistor 130.

Operational amplifier 10 further comprises a transistor 132, for example, of MOSFET type. Transistor 132 is coupled, preferably connected, between a conduction terminal of transistor 130 and rail 114.

Node 118 is thus coupled to rail 114 by transistor 130 and transistor 132 coupled in series. More particularly, transistor 130 is coupled, preferably connected, by a conduction terminal, for example, the source, to node 118. Transistor 130 is also coupled, preferably connected, by the other conduction terminal, for example, the drain, to node 134. Transistor 132 is also coupled, preferably connected, by a first conduction terminal, for example, the drain, to node 134 and by the other conduction terminal, for example, the source, to rail 114.

Transistors 127 and 132 are coupled in a current mirror configuration. In other words, the drain and the gate of transistor 132 are coupled, preferably connected, to each other and the gate of transistor 132 is coupled, preferably connected, to the gate of transistor 127. The current flowing through transistor 127, in other words, the current reaching node 126, is also substantially equal to the current flowing through transistors 130 and 132.

Operational amplifier 10 comprises a resistor 136, having a value Rref, and a current source 138, delivering a current Iref. Resistor 136 and current source 138 are series-coupled between rail 112 and rail 114. More particularly, resistor 136 is coupled, preferably connected, to rail 112 by a first terminal and to a node 140 by another terminal. Current source 138 is coupled, preferably connected, to node 140 by a first terminal and to rail 114 by another terminal.

Operational amplifier 10 further comprises an operational amplifier 144. Node 140 is coupled, preferably connected, to an input, preferably the non-inverting input, of operational amplifier 144. The other input of operational amplifier 144, preferably the inverting input, is coupled, preferably connected, to node 118.

During the operation of operational amplifier 10, a signal representative of voltage INP is delivered to the second stage, that is, the intermediary stage, by transistor 116a or by transistor 124a. Similarly, a signal representative of voltage INN is delivered to the second stage, that is, the intermediary stage, by transistor 116b or by transistor 124b.

For voltages INN and INP corresponding to an input voltage of the operational amplifier in common mode between the voltage of rail 114 and a threshold TH, transistors 116a and 116b are on and transistors 124a and 124b are off. Common mode means a configuration where the inverting input and the non-inverting input of operational amplifier 10 are coupled to each other. Signals INP and INN are thus substantially equal.

For voltages INN and INP corresponding to an input voltage of the operational amplifier in common mode between the voltage of rail 114 and a threshold TH, a voltage representative of the voltage between input nodes 102 and 104 is delivered to the intermediary stage by transistors 116a and 116b. Threshold TH is between the voltage of rail 114 and the voltage of rail 112, for example, between the ground and power supply voltage Vcc, for example, between 0 V and 5 V.

For voltages INN and INP corresponding to an input voltage of the operational amplifier in common node between threshold TH and the voltage of rail 112, transistors 124a and 124b are on and transistors 116a and 116b are off. Thus, for voltage INN and INP corresponding to an input voltage of the operational amplifier in common mode between threshold TH and the voltage of rail 112, a voltage representative of the voltage between input nodes 102 and 104 is delivered to the intermediary stage by transistors 124a and 124b.

The value of voltage Vref is selected so that transistor 130 turns on when voltages INP and INN reach values corresponding to an input voltage of the operational amplifier in common mode equal to threshold TH. Value Vref is determined by values Rref of resistor 136 and Iref of current source 138.

Figure 3:
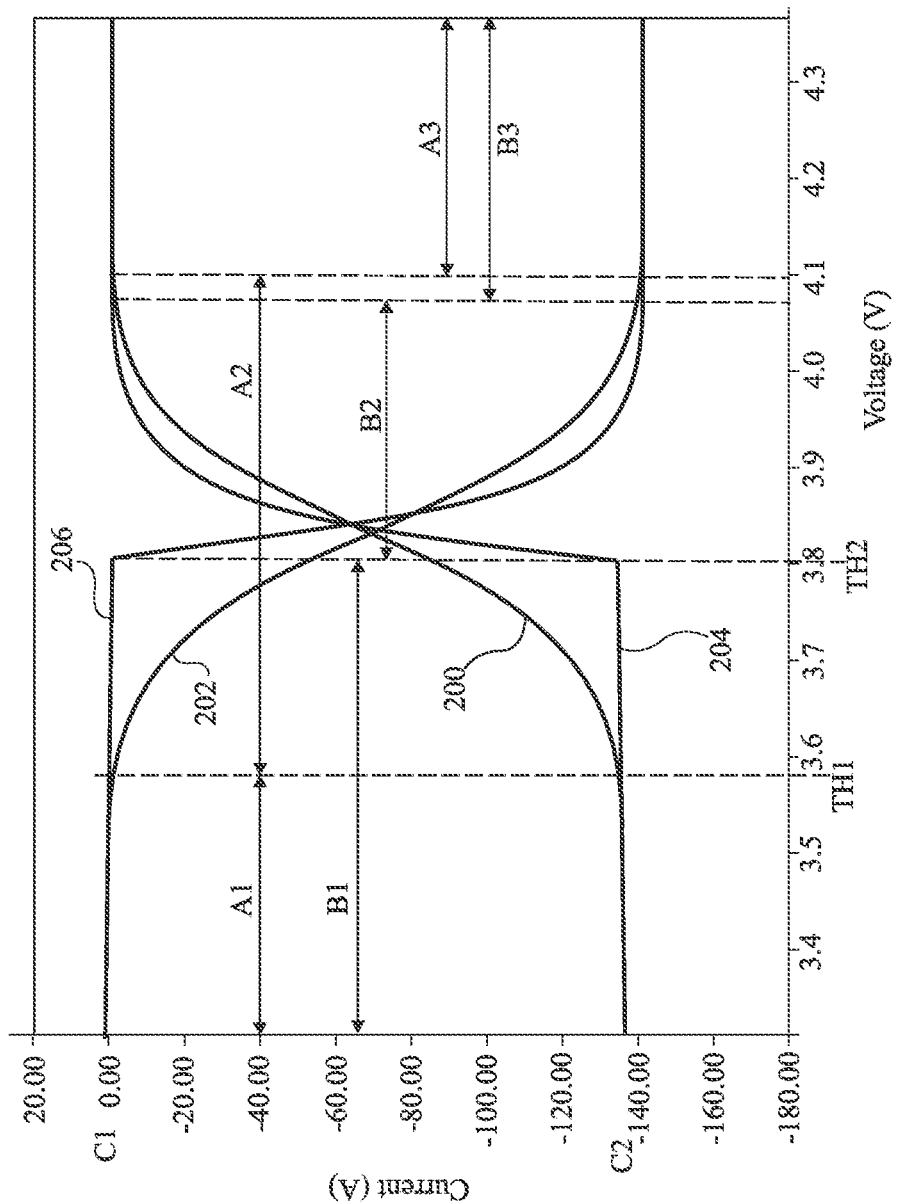
FIG. 3 shows examples of current variations in the embodiment of FIG. 2.

FIG. 3 shows examples of current variations. More particularly, FIG. 3 shows variations of currents (Current (A)) in the embodiment of FIG. 2 according to an input voltage (Voltage (V)) of operational amplifier 10 in common mode and variations of currents (Current (A)) in a device similar to the device of FIG. 2, different from the embodiment of FIG. 2 in that operational amplifier 144 is absent and the gate of transistor 130 is coupled, preferably connected, to node 140. FIG. 3 comprises: a first curve 204 showing the variations of the current flowing through transistor 116a in the embodiment of FIG. 2; a second curve 206 showing the variations of the current flowing through transistor 124a in the embodiment of FIG. 2; a third curve 200 showing the variations of the current flowing through transistor 116a in the device which does not comprise operational amplifier 144; and a fourth curve 202 showing the variations of the current flowing through transistor 124a in the device which does not comprise operational amplifier 144.

It is considered that in common mode, the current flowing through transistor 116a is substantially equal to the current flowing through transistor 116b and that the current flowing through transistor 124a is substantially equal to the current flowing through transistor 124b. Thus, the variations of the currents flowing through transistors 116a and 124a also correspond to the variations of the currents flowing through transistors 116b and 124b.

FIG. 3 shows three successive phases A1, A2, and A3 of operation of the device which does not comprise amplifier 144.

During first phase A1, transistors 124a and 124b, are off and transistors 116a and 116b are on. Thus, the currents flowing through transistors 124a and 124b, have a first value C1, substantially equal to zero. In the example of FIG. 3 the currents flowing through transistors 116a and 116b are substantially equal to value C2. Value C2 is non-zero, and preferably substantially constant all along phase A1. Value C2 is for example substantially equal to −134 µA. Curves 200 and 202 are thus substantially constant in phase A1.

Phase A1 ends when the common-mode input voltage reaches a threshold value TH1. In the example of FIG. 3, threshold TH1 has a value substantially equal to 3.58 V. Second phase A2 starts when the common-mode input voltage reaches a threshold value TH1.

Phase A2 is a transition phase. During phase A2, the current flowing through transistors 116a and 116b varies to pass from value C2 to value C1 and the current flowing through transistors 124a and 124b, varies to pass from value C1 to value C2. Thus, the current flowing through transistors 116a and 116b is substantially equal to C2 at the beginning of second phase A2 and to C1 at the end of second phase A2. Similarly, the current flowing through transistors 124a and 124b, is substantially equal to C1 at the beginning of second phase A2 and to C2 at the end of second phase A2. In the example of FIG. 3, during phase A2, curve 200 is increasing and curve 202 is decreasing.

During third phase A3, transistors 124a and 124b, are on and transistors 116a and 116b are off. Thus, the currents flowing through transistors 116a and 116b have a first value C1, substantially equal to zero. In the example of FIG. 3, the currents flowing through transistors 124a and 124b, are substantially equal to value C2. Curves 200 and 202 are thus substantially constant in phase A3.

FIG. 3 shows three successive phases B1, B2, and B3 of operation of the embodiment of the device 10 of FIGS. 1 and 2.

The variations of curves 204 and 206 are similar to the respective variations of curves 200 and 202. In other words, during phase B1, curves 204 and 206 are substantially constant and substantially equal to respective values C2 and C1. Phase B1 ends when the common-mode input voltage reaches a threshold value TH2.

During phase B2, curve 204 varies to pass from value C2, at the beginning of phase B2, to value C1 at the end of phase B2. Similarly, curve 206 varies to pass from value C1, at the beginning of phase B2, to value C2 at the end of phase B2.

During phase B3, curves 204 and 206 are substantially constant and substantially equal to respective values C1 and C2.

The variations of curves 204 and 206 differ from the variations of curves 200 and 202 in that the decrease of curve 206 and the increase of curve 204 are significantly faster, in particular before the crossing of curves 204 and 206. Thus, transition phase B2 is shorter than transition phase A2. It is thus possible to select a value of threshold TH2 greater than the value of threshold TH1 while keeping a phase B3 sufficiently long to be able to use the high values while having substantially constant curves 204 and 206. Value TH2 is between value TH1 and the value of the voltage of rail 112.

An advantage of the described embodiments is that the transition window between the P-type transistors and the N-type transistors of the embodiments, in other word the phase B2, is narrower than the transition window in the absence of the operational amplifier 144, in other words the phase A2. It allows the increase of the range of voltage values for which the operational amplifier 10 is precise.

Another advantage of the described embodiments is that the variations concerning the phase B2, its width and its values, between two distinct devices are less important than for devices without the operational amplifier 144. In particular, these variations only depend on the temperature and the dispersions related to the process. It allows the reduction of the value of the current source Io, and thus the miniaturization of the device.

Another advantage of the described embodiments is that the value of the threshold TH2 is higher than the value TH1, in other words the phase B1 starts with values lower than the values of B2 and that phase A2 is larger than phase A1. As phases A1 and A2 are the range of values within which the operational amplifier 10 has the best precision, increasing the lowest value of the transition window allows the amelioration of the precision of the operational amplifier 10 in the embodiments.

Various embodiments and alterations have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereinabove.

What is claimed is:

1. An electronic device comprising:
   a pair of first transistors, each first transistor being coupled to a first node by a conduction terminal of the first transistor;
   a pair of second transistors, each second transistor being coupled to a second node by a conduction terminal of the second transistor; and
   a third transistor having a conduction terminal coupled to the first node, a control terminal of the third transistor being coupled to an output of a first operational amplifier, the first operational amplifier being coupled, at its input, to the first node and to a node of application of a reference voltage.

2. The device according to claim 1, wherein the device is an operational amplifier device.

3. The device according to claim 1, further comprising a pair of fourth transistors, a second conduction terminal of the third transistor being coupled to a control terminal of a first one of the fourth transistors and a conduction terminal of a second one of the fourth transistors, a conduction terminal of the first one of the fourth transistors being coupled to the second node, and each fourth transistor coupled to a second power supply input, wherein the pair of fourth transistors are arranged as a current mirror.

4. The device according to claim 1, wherein the device comprises an inverting input, a non-inverting input, and two power supply inputs.

5. The device according to claim 4, wherein a control terminal of one of the first transistors and a control terminal of one of the second transistors are coupled to the non-inverting input and a control terminal of the other one of the first transistors and a control terminal of the other one of the second transistors are coupled to the inverting input.

6. The device according to claim 4, wherein the first node is coupled to a first power supply input of the two power supply inputs by a current source.

7. The device according to claim 4, wherein the second node is coupled to a second power supply input of the two power supply inputs by conduction terminals of a fourth transistor.

8. The device according to claim 7, wherein the second conduction terminal of the third transistor is coupled to a first conduction terminal of a fifth transistor, a second conduction terminal of the fifth transistor being coupled to the second power supply input, a control terminal of the fifth transistor being coupled to the first conduction terminal of the fifth transistor and to a control terminal of the fourth transistor.

9. The device according to claim 4, wherein a first non-inverting input of the first operational amplifier disposed in the device is coupled to a first power supply input of the two power supply inputs by a resistor and to a second power supply input of the two power supply inputs by a current source.

10. The device according to claim 1, wherein the first transistors are coupled by their sources to the first node and the second transistors are coupled by their sources to the second node.

11. The device according to claim 1, wherein a surface area of the third transistor is at least five times smaller than that of the first and second transistors.

12. An electronic device comprising:
   a pair of first transistors, each first transistor being coupled to a first node by a conduction terminal of the first transistor, wherein the first node is coupled to a first power supply input by a first current source;
   a pair of second transistors, each second transistor being coupled to a second node by a conduction terminal of the second transistor, wherein the second node is coupled to a second power supply input by conduction terminals of a fourth transistor; and
   a third transistor coupled to the first node, wherein a control terminal of the third transistor is coupled to an output of a first operational amplifier, and wherein the first operational amplifier is coupled, at its input, to the first node and to a node of application of a reference voltage.

13. The device according to claim 12, further comprising a pair of fourth transistors, a conduction terminal of the third transistor being coupled to a control terminal of a first one of the fourth transistors and a conduction terminal of a second one of the fourth transistors, a conduction terminal of the first one of the fourth transistors being coupled to the second node, and each fourth transistor coupled to the second power supply input, wherein the pair of fourth transistors are arranged as a current mirror.

14. The device according to claim 12, wherein a first conduction terminal of the third transistor is coupled to the first node and a second conduction terminal of the third transistor is coupled to a first conduction terminal of a fifth transistor, a second conduction terminal of the fifth transistor being coupled to the second power supply input, a control terminal of the fifth transistor being coupled to the first conduction terminal of the fifth transistor and to a control terminal of the fourth transistor.

15. The device according to claim 12, wherein the device is an operational amplifier comprising an inverting input, a non-inverting input, the first power supply input, and the second power supply input.

16. The device according to claim 15, wherein a control terminal of one of the first transistors and a control terminal of one of the second transistors are coupled to the non-inverting input and a control terminal of the other one of the first transistors and a control terminal of the other one of the second transistors are coupled to the inverting input.

17. The device according to claim 15, wherein a first non-inverting input of the first operational amplifier disposed in the device is coupled to the first power supply input by a resistor and to the second power supply input by a second current source.

18. The device according to claim 12, wherein the first transistors are coupled by their sources to the first node and the second transistors are coupled by their sources to the second node.

19. The device according to claim 12, wherein a surface area of the third transistor is at least five times smaller than that of the first and second transistors.

20. An electronic device, comprising:
a pair of first transistors, a control terminal of a first one of the first transistors coupled to a non-inverting input, a control terminal of a second one of the first transistors coupled to an inverting input, and a source terminal of each of the first transistors coupled to a current source through a first node;
a pair of second transistors, a control terminal of a first one of the second transistors coupled to the non-inverting input, a control terminal of a second one of the second transistors coupled to the inverting input, and a source terminal of each of the second transistors coupled to a second node;
an operational amplifier, a first input of the operational amplifier coupled to a reference voltage, and a second input of the operational amplifier coupled to the first node; and
a third transistor, a source terminal of the third transistor coupled to the first node, and a control terminal of the third transistor coupled to an output of the operational amplifier.

* * * * *